United States Patent
Charbonnel et al.

(10) Patent No.: US 11,226,358 B2
(45) Date of Patent: Jan. 18, 2022

(54) POWER SYSTEM DAMAGE ANALYSIS AND CONTROL SYSTEM

(71) Applicant: Caterpillar Inc., Deerfield, IL (US)

(72) Inventors: Sylvain Charbonnel, Peoria, IL (US); Frank Lombardi, Germantown Hills, IL (US)

(73) Assignee: Caterpillar Inc., Peoria, IL (US)

( * ) Notice: Subject to any disclaimer, the term of this patent is extended or adjusted under 35 U.S.C. 154(b) by 340 days.

(21) Appl. No.: 16/287,515

(22) Filed: Feb. 27, 2019

(65) Prior Publication Data

US 2020/0271702 A1 Aug. 27, 2020

(51) Int. Cl.
*G01R 19/25* (2006.01)
*F02D 41/02* (2006.01)
*F02D 41/34* (2006.01)
*F02D 41/14* (2006.01)

(52) U.S. Cl.
CPC ..... *G01R 19/2513* (2013.01); *F02D 41/0205* (2013.01); *F02D 41/1486* (2013.01); *F02D 41/345* (2013.01); *F02D 2041/1433* (2013.01)

(58) Field of Classification Search
CPC ......... G01R 19/2513; F02D 2009/0277; F02D 41/0205; F02D 41/345; F02D 41/1468; F02D 41/222; F02D 2041/1433; F02D 2041/286; F02D 2041/227; F02D 2041/226; G05B 23/0221; E02F 9/267; E02F 9/2066; E02F 9/268; G07C 5/0816; G07C 5/0808
See application file for complete search history.

(56) References Cited

U.S. PATENT DOCUMENTS

| | | | |
|---|---|---|---|
| 5,315,972 A | 5/1994 | Judy et al. | |
| 9,803,576 B2 | 10/2017 | Commenda et al. | |
| 2017/0292250 A1 | 10/2017 | Sato et al. | |
| 2018/0030890 A1* | 2/2018 | Roe | F02D 41/22 |
| 2018/0030914 A1* | 2/2018 | Roe | F02D 35/023 |
| 2018/0156692 A1* | 6/2018 | Chen | F02P 5/1512 |
| 2019/0304214 A1* | 10/2019 | Mentele | G07C 5/0808 |
| 2020/0063668 A1* | 2/2020 | Jeong | F02D 35/027 |

* cited by examiner

Primary Examiner — George C Jin

(74) Attorney, Agent, or Firm — Harrity & Harrity LLP

(57) ABSTRACT

A damage analysis and control system is disclosed. An example process may include receiving a data set of measurements associated with a period of operation of a power system. The data set of measurements may identify a frequency that the power system is in an operating state during the period of operation, and the data set of measurements may identify a frequency of damage measurements associated with the operating state. The process may include determining, using a damage model and the data set of measurements, a damage score for the operating state during the period of operation of the power system. The process may include determining that the damage score satisfies a threshold damage score associated with the damage model and performing an action associated with the power system based on the damage score satisfying the threshold damage score.

21 Claims, 5 Drawing Sheets

POWER SYSTEM DAMAGE ANALYSIS AND CONTROL SYSTEM

TECHNICAL FIELD

The present disclosure relates generally to power systems and, more particularly, to a damage analysis and control for a power system.

BACKGROUND

Operating an engine (e.g., an engine of a power system) generally involves a trade-off between durability and performance. For example, the more aggressively an engine is operated for higher performance, the more likely that the engine is to be damaged at a faster rate (or lose durability) relative to the engine being operated less aggressively and/or operated for lower performance. Cumulative damage to the engine reduces the lifetime of the engine. In previous techniques, the engine can be continuously monitored via a damage model to detect damage to determine an operating state of the engine and corresponding damage to the engine. However, problems arise when such damage models repeatedly analyze the operating state and damage at a relatively high frequency because a relatively high amount of computing resources (e.g., processing resources and/or memory resources) are consumed, preventing a system (e.g., an engine control module (ECM)) from being able to monitor and/or control other aspects of the engine. On the other hand, additional problems arise when such damage models analyze the damage at a relatively low frequency because such damage models lose accuracy with respect to predictability or determining a cumulative damage and/or may detect damage to the engine after the level of damage to the engine has reached a catastrophic level or a level that reduces a lifetime of the engine.

One approach, in U.S. Pat. No. 9,803,756 that issued to Commenda et al. on Oct. 31, 2017 ("the '576 patent"), describes predicting calibration values. In particular, the '576 patent discloses a system to predict calibration values for a vehicle. The system is configured to receive a plurality of training data sets for a component of the vehicle. Each of the training data sets includes one or more training inputs and one or more corresponding training outputs. The system is further configured to automatically develop a prediction model based on the plurality of training data sets. The system is further configured to receive an input data set and determine, using the prediction model, a predicted calibration value based on the input data set.

While the system of the '576 patent describes predicting the calibration values using training data sets, the system of the '576 patent does not provide a system that decreases a frequency at which the damage to an engine is determined while using received damage measurements for operating states to determine an amount of damage to an engine.

The damage control system of the present disclosure solves one or more of the problems set forth above and/or other problems in the art.

SUMMARY

According to some implementations, a method may include receiving, during a period of operation of an engine, operating measurements for a set of operating parameters associated with the engine; identifying, based on the operating measurements, an operating state of the engine during the period of operation; receiving damage measurements for a damage parameter associated with the engine, wherein the damage measurements are associated with the engine being in the operating state during the period of operation; storing the damage measurements in a damage profile for the operating state, wherein the damage profile is configured to store the damage measurements based on the engine being in the operating state; determining, via a damage model and based on the damage profile, a damage score associated with the operating state during the period of operation, wherein the damage model is configured to determine the damage score based on an amount of time that the engine was in the operating state during the period of operation and the damage measurements; and configuring, based on the damage score, one or more control devices to control the engine based on the damage score.

According to some implementations, a device may include a memory; and one or more processors, communicatively coupled to the memory, to: receive, during a period of operation of an engine, sets of measurements associated with the engine, wherein the sets of measurements include sets of operating measurements and sets of damage measurements; identify operating states of the engine during the period of operation based on the sets of operating measurements; for each set of measurements, store a corresponding set of damage measurements with a corresponding set of operating measurements in a data structure, wherein the data structure is configured to store damage profiles for the operating states of the engine, wherein the damage profiles for the operating states are based on the sets of damage measurements for the operating states; determine, based on a damage model and the damage profiles, damage scores for the operating states of the engine during the period of operation; and configure one or more control devices to control the engine based on the damage scores.

According to some implementations, a non-transitory computer-readable medium may store one or more instructions that, when executed by one or more processors of a device, cause the one or more processors to: receive a data set of measurements associated with a period of operation of an engine, wherein the data set of measurements identifies a frequency that the engine is in an operating state during the period of operation, and wherein the data set of measurements identifies a frequency of damage measurements associated with the operating state; determine, using a damage model and the data set of measurements, a damage score for the operating state during the period of operation of the engine, wherein the damage score is representative of an amount of damage incurred by the engine according to the damage model, and wherein the damage score is determined based on the frequency that the engine is in the operating state and the frequency of the damage measurements associated with the operating state; determine that the damage score satisfies a threshold damage score associated with the damage model; and perform an action associated with the engine based on the damage score satisfying the threshold damage score.

DETAILED DESCRIPTION

This disclosure relates to damage analysis and control for a power system using a damage control system. The damage control system, as described herein, has universal applicability to any machine utilizing such a damage control system. The term "machine" may refer to any machine that performs an operation associated with an industry such as, for example, mining, construction, farming, transportation, or any other industry. As some examples, the machine may be a vehicle, a backhoe loader, a cold planer, a wheel loader, a compactor, a feller buncher, a forest machine, a forwarder, a harvester, an excavator, an industrial loader, a knuckleboom loader, a material handler, a motor grader, a pipelayer, a road reclaimer, a skid steer loader, a skidder, a telehandler, a tractor, a dozer, a tractor scraper, a generator (or other type of machine for electric power generation), or other above ground equipment, underground equipment, aerial equipment, or marine equipment. Moreover, one or more implements may be connected to the machine and driven from the power system optimizer, as described herein.

Figure 1:
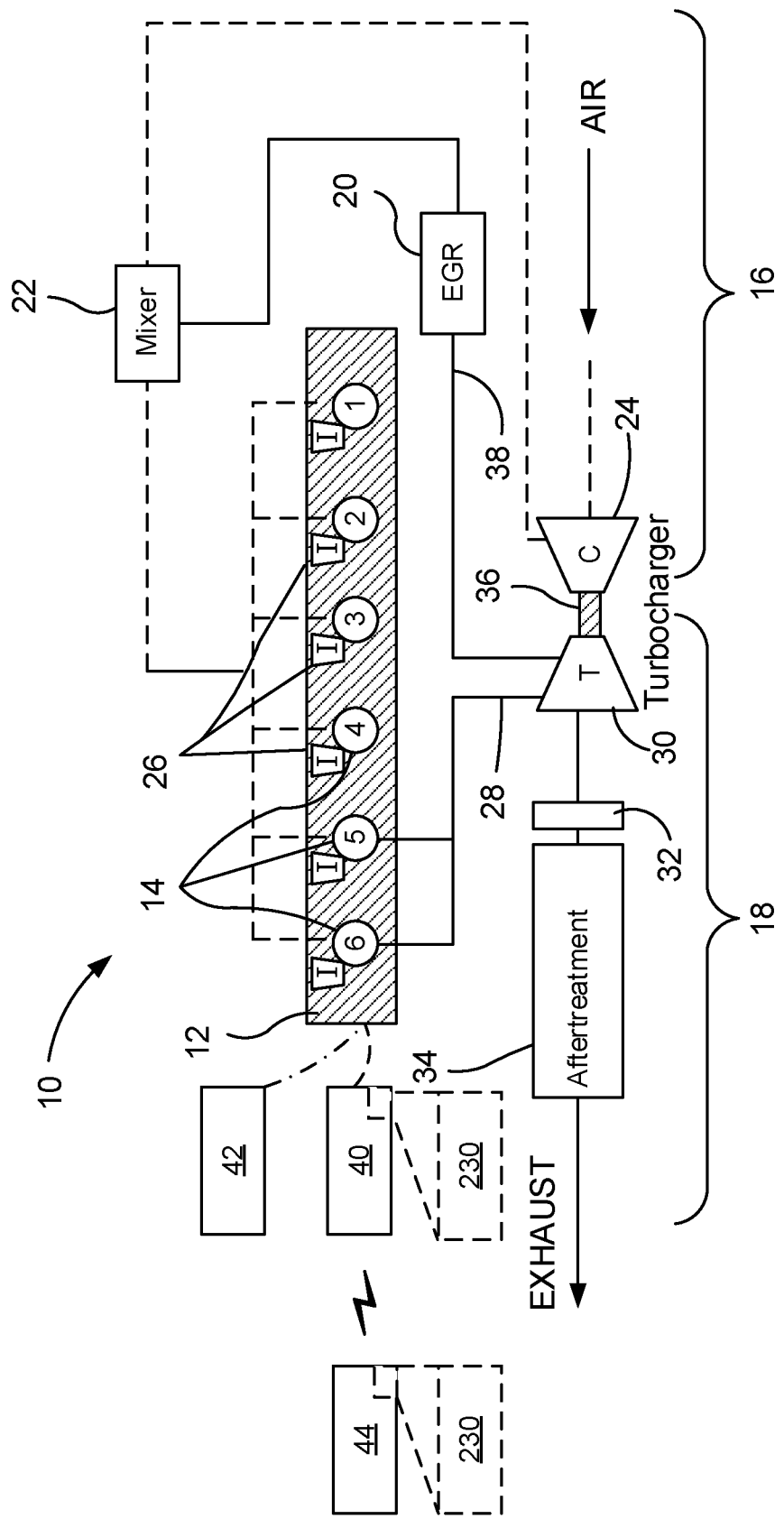
FIG. 1 is a diagram of an example power system described herein.

FIG. 1 is a diagram of an example power system 10 described herein. The power system 10 may be described herein as a compression ignition, internal combustion engine. However, the power system 10 may include any other type of internal combustion engine, such as, for example, a spark, laser, or plasma ignition engine. The power system 10 may be fueled by such fuels as distillate diesel fuel, biodiesel, dimethyl ether, gaseous fuels, such as hydrogen, natural gas, propane, alcohol, ethanol, and/or any combination thereof. Furthermore, the power system 10 may consume one or more consumable resources (e.g., a fuel (e.g., gasoline, diesel fuel, and/or the like), a diesel exhaust fluid (DEF), one or more coolants, one or more lubricants (e.g., an oil, a grease, and/or the like), and/or the like) during operation (e.g., due to combustion in the engine block).

Power system 10 includes an engine 12 with a plurality of cylinders 14 (engine 12 of FIG. 1 is shown with six cylinders 14). A piston assembly may be included within each of cylinders 14 to form a combustion chamber within each cylinder 14. Power system 10 may include any number of combustion chambers and the combustion chambers may be disposed in an in-line configuration, a "V" configuration, or in any other suitable configuration.

Power system 10 may include multiple systems. For example, as shown in the example of FIG. 1, power system 10 may include an air intake or air induction system 16, an exhaust system 18, and an exhaust gas recirculation (EGR) system 20. Air induction system 16 may be configured to direct air, or an air and fuel mixture (e.g., of air and another gas, such as exhaust gas) into power system 10 for subsequent combustion. Exhaust system 18 may exhaust or release byproducts of the combustion to an atmosphere external to power system 10. A recirculation loop of the EGR system 20 may be configured to direct a portion of the exhaust gases from exhaust system 18 back into air induction system 16 for subsequent combustion.

Air induction system 16 may include multiple components that cooperate to condition and introduce compressed air into cylinders 14. For example, air induction system 16 may include a mixer 22, or intake manifold, located downstream of one or more compressors 24. The air induction system 16 feeds variable valve actuators 26 associated with respective ones of cylinders 14. Air induction system 16 may include a throttle valve, an air cooler, a filtering component, a compressor bypass component, and/or the like. As described herein, various adjustable parameters (e.g., controllable parameters or parameters that are capable of being controlled by a control device) associated with air induction system 16 may be controlled (e.g., by one or more control devices) according to a determined level of damage associated with power system 10. For example, a damage analysis may be iteratively performed to determine a level of damage associated with one or more components of engine 12. Further, the level of damage, may indicate (e.g., based on a mapping of the level of damage to one or more values of the adjustable parameters) that one or more of the following are to be controlled: a pressure of air that is to enter a combustion chamber (e.g., by adjusting a setting of compressor 24), to identify timing of the air as the air enters the combustion chamber (e.g., by adjusting opening timing and/or closing timing of variable valve actuators 26), to identify an intake throttle valve position (e.g., by adjusting a position of an intake throttle valve of air induction system 16), and/or the like.

Exhaust system 18 may include multiple components that cooperate to condition and direct exhaust from cylinders 14 to the atmosphere. For example, exhaust system 18 may include an exhaust passageway 28, one or more turbines 30 driven by exhaust flowing through exhaust passageway 28, a particulate collection device 32, such as a diesel particulate filter (DPF) located downstream of turbine 30, and an exhaust aftertreatment device 34 (e.g., an aftertreatment selective catalytic reduction (SCR)) fluidly connected downstream of particulate collection device 32. Exhaust system 18 may include one or more bypass components, an exhaust compression or restriction brake, an attenuation device, additional exhaust treatment devices, and/or the like.

Turbine 30 may be located to receive exhaust leaving power system 10, and may be connected to the one or more compressors 24 of air induction system 16 by way of a common shaft 36 to form a turbocharger. As exhaust gases exiting power system 10 flow through turbine 30 and expand against vanes thereof, turbine 30 may rotate and drive the one or more compressors 24 to pressurize inlet air.

Particulate collection device 32 may be a DPF located downstream of turbine 30 to remove particulate matter from the exhaust flow of power system 10. Further, particulate collection device 32 may include an electrically conductive or non-conductive coarse mesh metal or porous ceramic honeycomb medium. As the exhaust flows through the medium, particulates may be blocked by and trapped in the medium. Over time, the particulates may build up within the medium and, if unaccounted for, could affect engine performance by increasing exhaust backpressure. To minimize backpressure effects on engine performance, the collected particulates may be passively and/or actively removed through a regeneration process. When passively regenerated, the particulates deposited on the medium may chemically react with a catalyst, for example, a base metal oxide, a molten salt, and/or a precious metal that is coated on or otherwise included within particulate collection device 32 to lower the ignition temperature of the particulates. Because particulate collection device 32 may be closely located downstream of engine 12 (e.g., immediately downstream of turbine 30, in one example), the temperatures of the exhaust flow entering particulate collection device 32 may be controlled to be high enough, in combination with the catalyst, to burn away the trapped particulates. When actively regenerated, heat is applied to the particulates deposited on the filtering medium to elevate the temperature thereof to an ignition threshold. In accordance with yet other implementations described herein, an active regeneration device (not shown), such as a fuel-fired burner or an electric heater, may be located proximal (e.g., upstream of) particulate collection device 32 to assist in controlling the regeneration of the particulate collection device 32. A combination of passive and active regeneration may be utilized, if desired.

Exhaust aftertreatment device 34 may receive exhaust from turbine 30 and trap or convert particular constituents in the gas stream. In one example, exhaust aftertreatment device 34 may embody a selective catalytic reduction (SCR) device having a catalyst substrate located downstream from a reductant injector. A gaseous or liquid reductant, most commonly urea or a water and urea mixture may be sprayed or otherwise advanced into the exhaust upstream of catalyst substrate by a reductant injector. As the reductant is absorbed onto the surface of catalyst substrate, the reductant may react with NOx (NO and NO2) in the exhaust gas to form water (H2O) and elemental nitrogen (N2). In some embodiments, a hydrolysis catalyst may be associated with catalyst substrate to promote even distribution and conversion of urea to ammonia (NH3).

In accordance with other implementations of the present disclosure, the reduction process may also include an oxidation catalyst, which, for example, may include a porous ceramic honeycomb structure or a metal mesh substrate coated with a material, for example a precious metal, that catalyzes a chemical reaction to alter the composition of the exhaust. For example, the oxidation catalyst may include platinum that facilitates the conversion of NO to NO2, and/or vanadium that suppresses the conversion.

The exhaust aftertreatment device 34 may require desulphation to maintain an acceptable NOx conversion rate. Similar to a regeneration event of the particulate collection device 32, the desulphation event may require increased exhaust temperatures. Decoupling an intake valve actuation (IVA) control from the EGR control during desulphation, for example, may provide enhanced capability for thermal management of the exhaust during such maintenance events.

Various adjustable parameters associated with exhaust system 18 may be controlled according to a determined level of damage associated with power system 10 (or a component of power system 10). For example, the level of damage may indicate that one or more of the following are to be controlled: an open area of an exhaust backpressure valve (e.g., by adjusting a position of a backpressure valve of exhaust system 18), a mass flow through particulate collection device 32 (e.g., by performing active and/or passive regeneration via particulate collection device 32), a pressure of the exhaust gases (e.g., by adjusting a temperature and/or a pressure in the exhaust downstream from turbine 30), and/or the like.

EGR system 20 may redirect gases from exhaust system 18 back into air induction system 16 for subsequent combustion. EGR is a process whereby exhaust gas from the engine is recirculated back into air induction system 16 for subsequent combustion. The recirculated exhaust gases may reduce the concentration of oxygen within the combustion chambers, and simultaneously lower the maximum combustion temperature therein. The reduced oxygen levels may provide fewer opportunities for chemical reaction with the nitrogen present, and the lower temperature may slow the chemical process that results in the formation of NOx. As mentioned above, a cooler may be included to cool the exhaust gases before the gases are combusted.

When utilizing EGR in a turbocharged diesel engine, the exhaust gas to be recirculated may be removed upstream of the exhaust gas driven turbine 30 associated with the turbocharger. For example, in many EGR applications, the exhaust gas may be diverted from the exhaust passageway 28 and diverted via an EGR conduit 38 to air induction system 16. Likewise, the recirculated exhaust gas may be re-introduced to the air induction system 16 downstream of the compressor 24. system 20 may be an external EGR system and/or may include various features for implementation of the methods described herein, such as a system of primary control and bypass valves to allow an engine control module (ECM) 40 to control various flows through the EGR system during selected engine operating conditions.

As described herein, various adjustable parameters associated with EGR system 20 may be controlled according to a level of damage to engine 12 (or a component of power system 10). For example, a damage analysis may be iteratively performed to determine a level of damage to engine 12 (or a component of power system 10). The level of damage may indicate that mass flow of exhaust gas through EGR system 20 is to be controlled to a particular setting (e.g., by adjusting an EGR bypass valve and/or the like connected to EGR conduit 38).

Power system 10 includes an ECM 40. The ECM 40, as described herein, provides control of power system 10 based on a level of damage associated with power system 10 and/or engine operating states as indicated by a sensor system 42. ECM 40 may execute the instructions to perform various control functions and processes to control power system 10 and to automatically adjust adjustable parameters of power system 10. ECM 40 may include any appropriate type of engine control system configured to perform engine control functions such that power system 10 may operate properly. Further, ECM 40 may also control another system of a vehicle or machine, such as a transmission system, a hydraulics system, and/or the like.

Sensor system 42 may provide measurements associated with various parameters used by ECM 40 to control power system 10 and/or to determine a level of damage associated with power system 10. Sensor system 42 may include physical sensors and/or any appropriate type of control system that generates values of sensing parameters based on a computational model and/or one or more measured parameters. The sensing parameters may include one or more operating parameters that identify an operating state of engine 12 and/or one or more damage parameters that identify a level of damage or an aspect of damage of engine 12 (and/or component of power system 10).

As used herein, sensing parameters, including operating parameters and/or damage parameters, may refer to those measurement parameters that are directly measured and/or estimated by one or more sensors (e.g., physical sensors, virtual sensors, and/or the like). Example sensors may include temperature sensors, speed sensors, chemical composition sensors (e.g., a NOx emission sensor), pressure sensors, and/or the like. Sensing parameters may also include any output parameters that may be measured indirectly by physical sensors and/or calculated based on readings of physical sensors. Measurements from the sensing parameters, as used herein, may refer to any values relevant to the sensing parameters and indicative of the operating state of power system 10 and/or a level of damage associated with power system 10. For example, operating measurements and/or damage measurements may be associated with machine parameters and/or environmental parameters, such as compression ratios, turbocharger efficiency, after cooler characteristics, temperature values, pressure values, ambient conditions, fuel rates, engine speeds, and/or the like. Measurements may be included as inputs to be provided to one or more virtual sensors associated with one or more damage parameters of a damage model. The damage model may be utilized by ECM 40 determine a level of damage associated with power system 10.

A virtual sensor associated with a crank angle of engine 12 may be utilized to determine a level of damage associated with one or more components of engine 12 (e.g., piston assembly, cylinders 14, and/or the like). The virtual sensor may utilize one or more physical sensors that indicate a position of a crankshaft of engine 12 relative to a piston assembly of cylinder 14. As described herein, one or more damage models may be configured to utilize the measurements to determine a level of damage associated with power system 10. For example, a damage model may be configured to determine a level of damage to one or more of cylinders 14 based on the virtual sensor associated with the crank angle of engine 12. One or more other types of damage models may be utilized, as described herein, to determine a level of damage associated with power system 10 and/or a level of damage associated with corresponding components (e.g., parts) of engine 12. A damage model may be designated to detect damage associated with a particular component of power system 10.

Sensor system 42 may be configured to coincide with ECM 40, may be configured as a separate control system, and/or may be configured as a part of other control systems. Further, ECM 40 may implement the sensor system 42 by using computer software, hardware, or a combination of software and hardware. For example, ECM 40 may execute instructions to cause sensors of sensor system 42 to sense and/or generate values of sensing parameters (e.g., damage parameters) based on a damage model and/or other parameters.

User device 44 may include one or more devices associated with receiving, generating, storing, processing, and/or providing information associated with damage to power system 10. For example, user device 44 may include a computing device, such as a mobile phone (e.g., a smartphone, a radio telephone, and/or the like), a computer or workstation, an operator station of a machine associated with power system 10, and/or the like. User device 44 may be separate from and/or remotely located from ECM 40.

In operation, computer software instructions may be stored in or loaded to ECM 40. ECM 40 may execute the computer software instructions to perform various control functions and processes to control power system 10 and to automatically adjust engine operational parameters, such as fuel injection timing and fuel injection pressure, one or more operational temperatures, one or more mass flows, and/or the like. ECM 40 may execute computer software instructions to generate and/or operate sensor system 42 to provide engine temperature values, engine pressure values, engine emission values, engine speed values, actuator or valve position values, and/or other parameter values used to monitor and/or control power system 10.

ECM 40 may also identify, obtain, and/or determine operation parameters that are associated with states (e.g., as sensed by sensor system 42) corresponding to one or more operations of power system 10, such as engine speed, fuel rate or quantity, injection timing, intake manifold temperature (IMAT), intake manifold pressure (IMAP), intake valve actuation (IVA) end of current, IVA timing, intake throttle valve position, injection air pressure, injection fuel pressure, torque delivered by the engine, total fuel injection quantity, exhaust pressure, number of cylinders 14 firing, oxygen/fuel molar ratio, ambient temperature, ambient pressure (e.g., barometric pressure), mass flow through particulate collection device 32, exhaust backpressure valve position, shot mode, coolant temperature, total induction mass flow in multi-shot mode, dwell (e.g., length of time between shots) in multi-shot mode, and/or the like. The non-adjustable parameters may be measured by certain physical sensors, such as a high precision lab grade physical sensor, or created by other control systems.

In FIG. 1, a damage management device 230 (further described below in connection with FIG. 2) may be included within and/or implemented by ECM 40 and/or user device 44. As indicated above, FIG. 1 is provided as an example. Other examples are possible and may differ from what was described in connection with FIG. 1.

Figure 2:
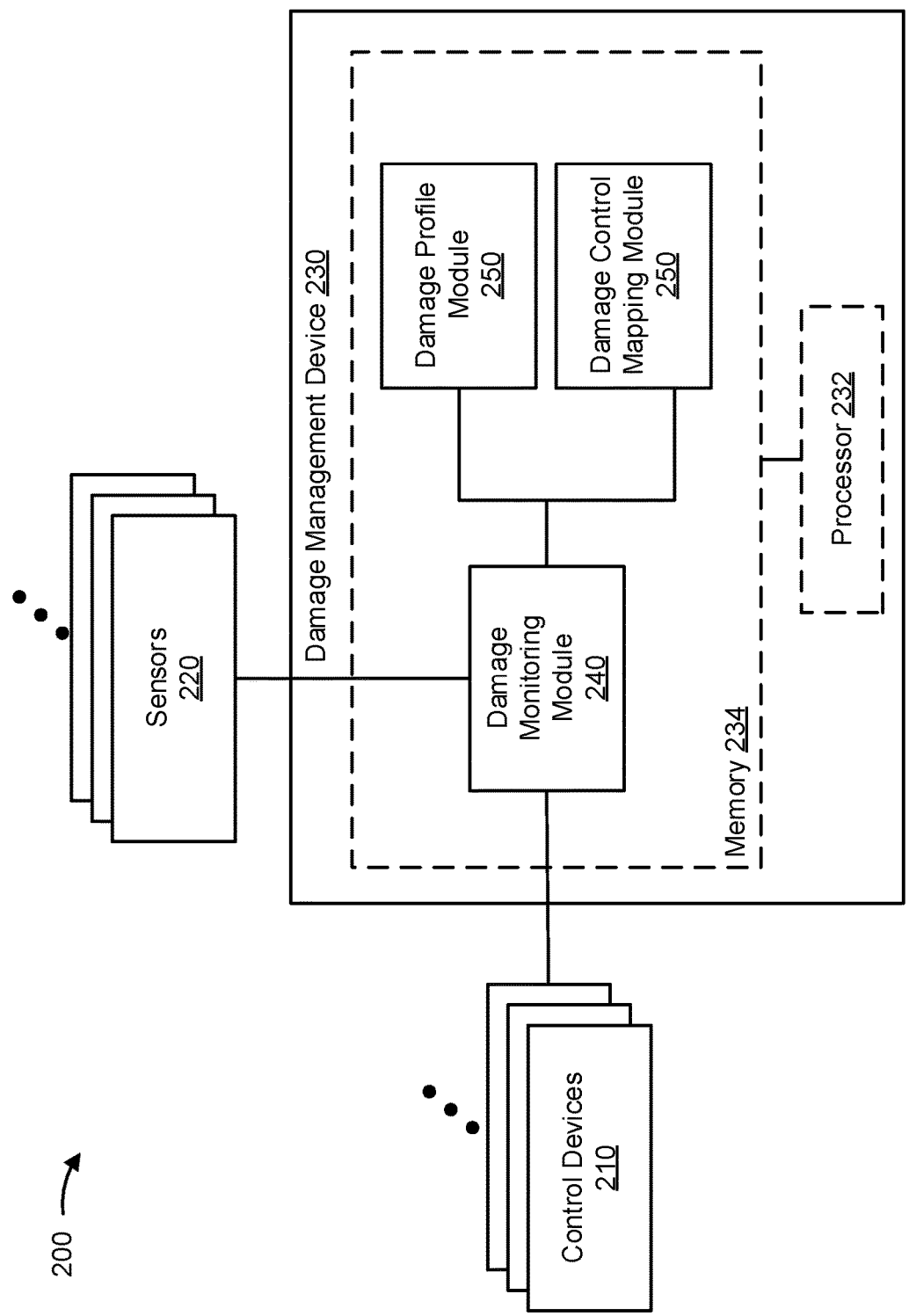
FIG. 2 is a diagram of an example damage control system that may be included within the power system of FIG. 1, as described herein.

FIG. 2 is a diagram of an example damage control system 200 in which systems and/or methods described herein may be implemented. As shown in FIG. 2, damage control system 200 may include one or more control devices 210 (referred to individually as "control device 210" and collectively as "control devices 210"), one or more sensors 220 (referred to individually as "sensor 220" and collectively as "sensors 220"), and a damage management device 230. As shown in FIG. 2, damage management device 230 may include a processor 232, a memory 234, a damage monitoring module 240, a damage profile module 250, and a damage control mapping module 260. As described herein, damage management device 230 is implemented in hardware via processor 232 and/or memory 234.

Control device 210 may be any type of device that may be used by ECM 40 to control a performance feature of power system 10. For example, control device 210 may include one or more actuators, switches, and/or the like that are capable of opening and/or closing a valve within power system 10, adjusting a temperature within power system 10 (e.g., using a fan, a cooling system, and/or the like), adjusting a pressure within power system 10, and/or the like.

Control device 210 may be associated with one or more adjustable parameters that may be optimized via an optimization process, as described herein. For example, a value of the adjustable parameter for control device 210 may represent or indicate a setting of the control device 210, such as a position of an actuator, a length of time that a valve is open, a position of the valve, a temperature at which power system 10 operates, a pressure at which to compress air and/or fuel, and/or the like.

Sensors 220 may include any type of sensor configured to measure operating conditions of power system 10. Sensors 220 may be sensors of sensor system 42, as described herein. For example, the sensors 220 may include temperature sensors (e.g., to detect temperature of air, exhaust, a component, coolant, and/or the like), position sensors (e.g., to detect a position of a valve, an actuator, an engine part (e.g., a piston), and/or the like), speed sensors (e.g., to detect an engine speed, a machine speed, and/or the like), pressure sensors (e.g., to detect a measure of compression of air or exhaust in power system 10), emissions sensors (e.g., to detect emission levels of power system 10), and/or the like.

Sensor 220 may be associated with one or more sensing parameters (e.g., operating parameters and/or damage parameters) that may be used in determining an operating state of power system 10 and/or a level of damage associated with power system 10, as described herein. For example, a value of an operating parameter and/or a damage parameter for sensor 220 may represent or indicate a measurement of the sensor 220, such as a measured temperature by a temperature sensor, a measured timing of a valve opening and/or closing by a position sensor, a measured speed of an engine by a speed sensor, a measured position of an actuator by a position sensor, measured emissions by an emissions sensor, and/or the like.

Damage management device 230 may correspond to ECM 40 and/or user device 44 of FIG. 1. Processor 232 is implemented in hardware, firmware, and/or a combination of hardware and software. Processor 232 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. Processor 232 includes one or more processors capable of being programmed to perform a function. Memory 234 includes a random-access memory (RAM), a read only memory (ROM), and/or another type of dynamic or static storage device (e.g., a flash memory, a magnetic memory, and/or an optical memory) that stores information and/or instructions for use by processor 232 (e.g., information and/or instructions associated with damage monitoring module 240, damage profile module 250, damage control mapping module 260, and/or the like).

Damage monitoring module 240 is configured to determine a level of damage (or a damage score) associated with power system 10 and/or configure control devices 210 to control power system 10. Damage monitoring module 240 may receive measurements associated with operating parameters and/or damage parameters of power system 10. As described herein, the operating parameters may indicate and/or define an operating state of power system 10 (or engine 12), and the damage parameters may indicate, according to one or more damage models, a level of damage associated with power system 10. Damage monitoring module 240 may identify the operating parameters and/or the damage parameters of power system 10. For example, damage monitoring module 240 may identify the operating parameters based on the sensors 220 that are communicatively coupled to damage management device 230 and/or may identify the damage parameters based on one or more damage models associated with damage monitoring module 240. The operating parameters may include one or more of an injection pressure, an injection timing, a speed of the engine, a fuel flow rate, IMAP, or IMAT.

As described herein, the damage monitoring module 240 may store measurements (e.g., operating measurements and/or damage measurements) in a damage profile maintained by damage profile module 250. For example, the damage monitoring module 240 may receive the measurements periodically (e.g., every 10 milliseconds (ms), 20 ms, 50 ms, and/or the like) and store the measurements in the profile. The damage profile may store the measurements for periods of operation of power system 10. Accordingly, damage monitoring module 240 may maintain a record of operating states of power system 10 within a damage profile. The damage profile may store the measurements based on (e.g., sorted by) operating states identified from operating measurements. In such cases, the damage profile may store corresponding damage measurements that were measured and/or received while power system 10 was in those operating states. Accordingly, the damage profile module 250 may receive the measurements, sort the measurements based on being operating measurements and/or damage measurements, and store the operating measurements along with corresponding damage measurements in a damage profile. As described herein, a damage profile may correspond to one or more periods of operation, one or more operating states of an engine during the one or more periods of operation, and/or the like.

The damage profile module 250 may maintain historical damage information associated with power system 10 and/or one or more other power systems that are associated with (e.g., same type, used in same machines, and/or the like) power system 10. The historical damage information may be associated with a particular damage parameter that is monitored and/or analyzed by damage monitoring module 240 and/or damage profile module 250. The historical damage information may include previously calculated levels of damage associated with power system 10, levels of damage associated with one or more other power systems associated with the power system 10, or expected levels of damage associated with power system 10. The expected levels of damage may include and/or be determined from empirical data identifying common or known levels of damage experienced by power systems that have relatively the same characteristics (e.g., type, usage rate, total usage, usage type, and/or the like) as power system 10.

According to some implementations, a duration of a period of operation may be substantially longer than a time period between receiving sets of measurements from sensors 220. For example, the duration of the period of operation may be 10 seconds, 20 seconds, 40 seconds, and/or the like. Accordingly, the duration of the period of operation (and/or a rate at which damage profiles may be analyzed) can be one thousand times longer than the time period between receiving damage measurements. In this way, while the frequency of analyzing the measurements is less, the number of the measurements is still the same. By extrapolating levels of damage for certain operating states, based on the frequency of the operating state during the period of operation, the damage management device 230 can determine an amount of damage caused to the power system 10 during the period of operation.

As described herein, a damage model may be used to determine a level of damage (e.g., an amount of damage, a degree of damage, and/or the like) of power system 10, of a component of power system 10, and/or the like. The level of damage may be representative of a usage of power system 10, a deterioration of a component of power system 10, and/or the like. The level of damage may be indicative of a remaining useful life, period of time remaining until power system 10 experiences a failure and/or a component of power system 10 fails. One or more damage models may be utilized by damage monitoring module 240 to determine a level of damage associated with one or more corresponding components of power system 10. Accordingly, one or more damage scores associated with each of the one or more damage models may be used to determine the level of damage to power system 10. A damage model may be associated with a particular damage parameter (e.g., crank angle of engine 12, a temperature associated with power system 10, a pressure associated with power system 10, and/or the like). Furthermore, the damage parameter may indicate a level of damage of a particular component of power system 10.

Damage monitoring module 240 may use a damage model to determine damage associated with power system 10 during one or more operating states of a period of operation. In such cases, the damage monitoring module 240 may identify the operating states of power system 10 based on operating measurements received from sensors 220. For example, damage monitoring module 240 may identify the operating states of power system 10 based on one or more ranges of the measurements for corresponding operating parameters of power system 10. Damage monitoring module 240 may use the damage model according to a predetermined schedule (e.g., after the expiration of a predetermined period of operation) and/or based on a particular event (e.g., a damage measurement being outside of a threshold damage measurement range). As described herein, a damage model may determine one or more damage scores from damage parameters of power system 10. The damage scores may be representative of a level of damage, representative of a type of damage caused to power system 10, and/or representative of a status of the damage of power system 10 and/or one or more components of power system 10.

Damage management device 230 may use control values for control devices 210 in a control profile (e.g., an optimization profile) of damage control mapping module 260 to configure settings of control devices 210 during operation of power system 10. For example, the damage control mapping module 260 may include settings for control devices 210 to indicate how the control devices are to be configured based on a particular level of damage to power system 10 and/or based on a particular level of damage to one or more components of power system 10. Accordingly, damage management device 230 may control control devices 210 to adjust settings of the control devices 210 to account for a determined damage to power system 10 and/or to one or more components of power system 10. Damage management device 230 may dynamically configure control devices 210 to be set to prevent further damage to power system 10 and/or further damage to one or more components of power system 10, based on an identified level of damage to power system 10 and/or an identified level of damage to the one or more components of power system 10.

Damage management device 230 may send a notification associated with a determined level of damage. For example, based on the damage monitoring module 240 and/or the damage profile module 250 indicating that a level of damage of power system 10, while in a particular operating state, satisfies a threshold, damage management device 230 may send a notification to an operator of a machine associated with power system 10 (e.g., via an operator station of the machine, via a user device associated with the operator, and/or the like) to alert the operator of the level of damage. In such cases, the operator may modify the operation of the machine to account for the level of damage caused in the operating state (e.g., by avoiding the operating state). The threshold may indicate that the damage may result in a failure of power system 10, may indicate that one or more components of power system 10 may fail, and/or the like), and/or the like. The damage management device 230 may send a control message to a machine associated with power system 10 to cause the machine to alter one or more operations. For example, the control message may prevent power system 10 from operating in a particular operating state. In this way, the damage management device 230 may perform one or more actions associated with power system 10 based on a determined level of damage.

In this way, damage management device 230 may utilize a damage model of damage monitoring module 240, a damage profile of damage profile module 250, and/or settings of damage control mapping module 260 to monitor damage, determine that a level of damage satisfies a threshold, and configure power system 10 to be controlled according to one or more settings based on the level of damage satisfying the threshold.

The number and arrangement of devices shown in FIG. 2 are provided as an example. In practice, there may be additional devices, fewer devices, different devices, or differently arranged devices than those shown in FIG. 2. Furthermore, two or more devices shown in FIG. 2 may be implemented within a single device, or a single device shown in FIG. 2 may be implemented as multiple, distributed devices. A set of devices (e.g., one or more devices) of damage control system 200 may perform one or more functions described as being performed by another set of devices of damage control system 200.

Figure 3:
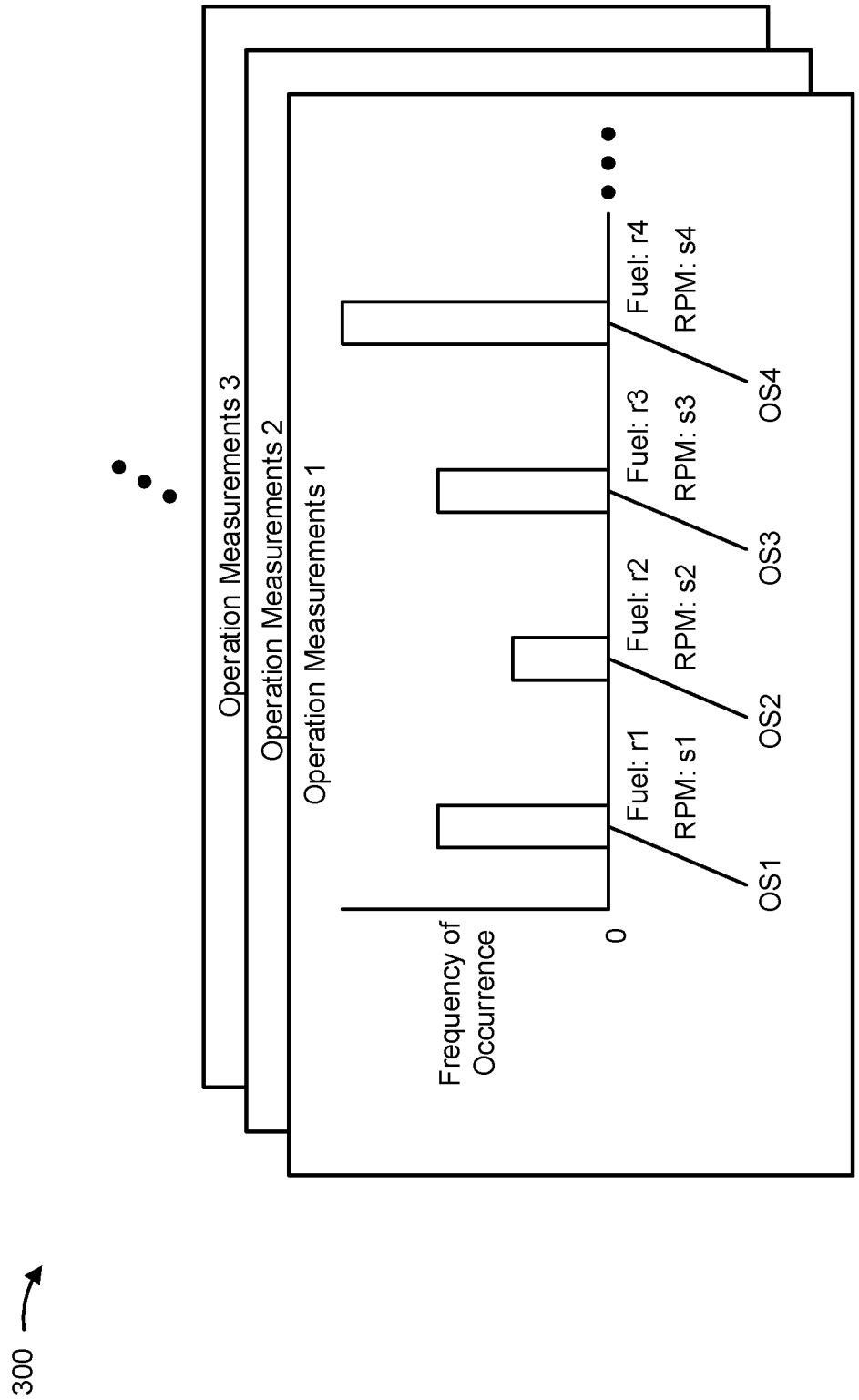
FIGS. 3 and 4 are diagrams of example representations of data sets that may be generated and/or used by the damage control system of FIG. 2, as described herein.

FIG. 3 is a diagram of an example representation of a data set 300 that may be generated and/or used by damage control system 200 of FIG. 2. As shown in FIG. 3, data set 300 may be configured as histograms of frequencies at which operating states (shown as OS1, OS2, OS3, and OS4) occur during periods of operation. Data set 300 may be stored as part of a damage profile for each of the periods of operation.

The damage monitoring module 240 may determine operating states based on operating measurements for the operating parameters being in clusters. For example, for period of operation 1, a first set of measurements for fuel flow may be within a threshold range of a first rate r1, a second set of measurements for fuel flow may be within a threshold range of a second rate r2, a third set of measurements for fuel flow may be within a threshold range of a third rate r3, and a fourth set of measurements for fuel flow may be within a threshold range of a fourth rate r4. Similarly, speeds s1, s2, s3, and s4 for the operating states of period of operation 1 can be identified and/or clustered to designate and/or identify operating states OS1, OS2, OS3, and OS4.

As described herein, a damage model may determine a damage for one set of damage measurements corresponding to each one of the operating states, and determine an overall damage caused by the operating state based on the frequency of the operating states OS1, OS2, OS3, and OS4 occurring during each of the periods of operation.

In this way, damage management device 230 may generate, store, and/or utilize a data set (e.g., in a damage profile) that permits a damage model to determine a level of damage (e.g., or damage score) associated with power system 10 when in a particular operating state during a period of operation based on an amount of time that power system 10 was in operating state and/or a set of damage measurements (e.g., a single set of damage measurements) captured at substantially a same moment in time during the period of operation.

As indicated above, FIG. 3 is provided as an example. Other examples are possible and may differ from what was described in connection with FIG. 3.

Figure 4:
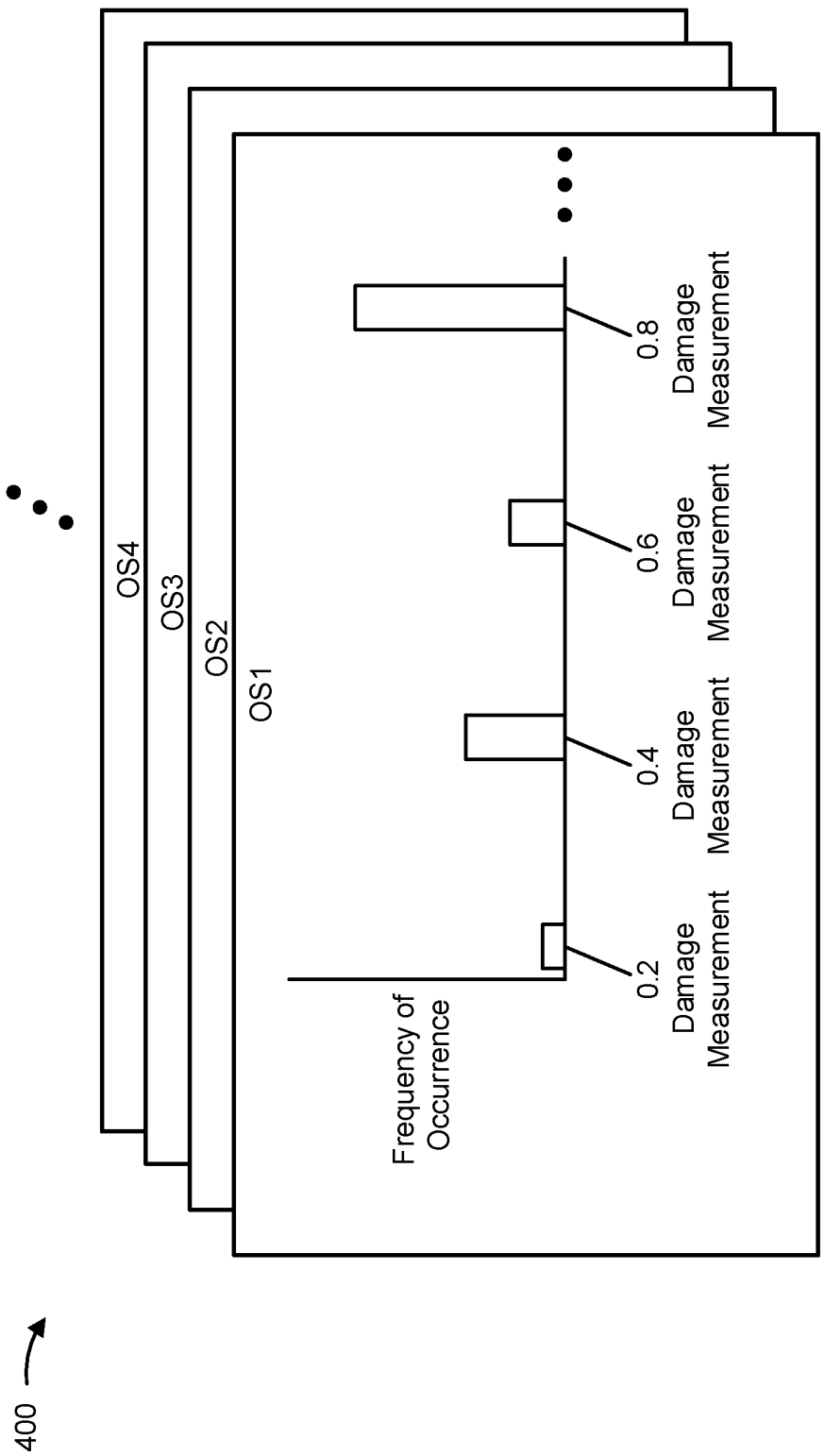

FIG. 4 is a diagram of an example representation of a data set 400 that may be generated and/or used by damage control system 200 of FIG. 2. As shown in FIG. 4, data set 400 may be configured as histograms of frequencies at which damage measurements are measured for operating states (shown as OS1, OS2, OS3, and OS4). Data set 400 maybe stored in a damage profile for the operating states as historical information. For example, data set 400 may be an accumulation of damage scores generated by damage management device 230 and/or one or more other damage management devices that monitor a power system similar to power system 10.

As shown in FIG. 4, various damage measurements may be received under a first operating state (OS1). The various damage measurements may be different based on various other characteristics of power system 10 or other power systems similar to power system 10 that were monitored to generate Data set 400. As described herein, a damage model associated with damage management device 230 may use data set 400 to determine a level of damage (or a damage score) for an operating state. The damage model may utilize and/or compare data set 400 to one or more other data sets (e.g., data set 300, a data set of characteristics of power systems associated with data set 400, and/or the like) to determine a level of damage to power system 10 during a period of operation.

Data set 400 may include expected damage measurements for an operating state of power system 10. In such cases, damage management device 230 may compare data set 400 to measured damage measurements for a period of operation to determine whether the damage measurement is within an expected range. If the damage measurement is not within the expected range, damage management device 230 may cause the damage model to perform a damage analysis as, configure one or more control devices 210, and/or send a notification/alert to an operator or user device, as described herein.

In some implementations, if one of the histograms for an operating state of data set 400 indicates that the operating state is not associated with causing damage to power system 10 or does not cause damage to power system 10, damage management device 230 may determine that a damage model is not to determine a level of damage caused by the operating state (e.g., so as not to waste computing resources).

In this way, damage management device 230 may utilize a data set 400 that identifies damage measurements associated with operating states of power system 10 to determine a level of damage to a power system.

As indicated above, FIG. 4 is provided as an example. Other examples are possible and may differ from what was described in connection with FIG. 4.

Figure 5:
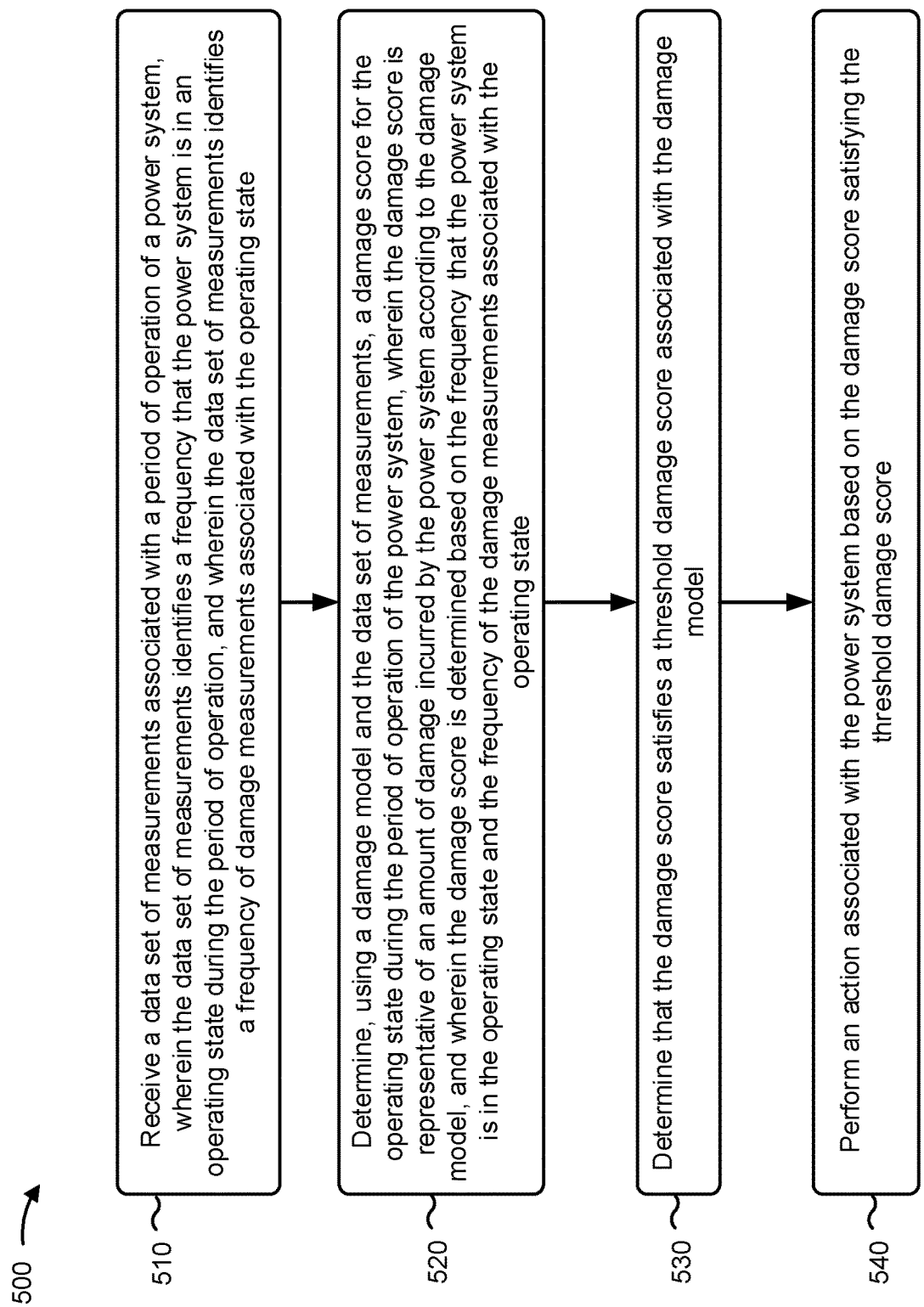
FIG. 5 is a flow chart of an example process associated with engine damage analysis and control.

FIG. 5 is a flow chart of an example process 500 associated with power system damage analysis and control. One or more process blocks of FIG. 5 may be performed by a damage management device (e.g. damage management device 230). Additionally, or alternatively, one or more process blocks of FIG. 5 may be performed by another device or a group of devices separate from or including the damage management device, such as an ECM (e.g., ECM 40), a user device (e.g., user device 44), and/or another device or component that is internal or external to a machine that includes power system 10.

As shown in FIG. 5, process 500 may include receiving a data set of measurements associated with a period of operation of a power system, wherein the data set of measurements identifies a frequency that the power system is in an operating state during the period of operation, and wherein the data set of measurements identifies a frequency of damage measurements associated with the operating state (block 510). For example, the damage management device (e.g., using processor 232, damage monitoring module 240, damage profile module 250, and/or the like) may receive a data set of measurements associated with a period of operation of a power system, as described above. The data set of measurements may identify a frequency that the power system is in an operating state during the period of operation and/or may identify a frequency of damage measurements associated with the operating state.

As further shown in FIG. 5, process 500 may include determining, using a damage model and the data set of measurements, a damage score for the operating state during the period of operation of the power system, wherein the damage score is representative of an amount of damage incurred by the power system according to the damage model, and wherein the damage score is determined based on the frequency that the power system is in the operating state and the frequency of the damage measurements associated with the operating state (block 520). For example, the damage management device (e.g., using processor 232, damage monitoring module 240, damage profile module 250, and/or the like) may determine, using a damage model and the data set of measurements, a damage score for the operating state during the period of operation of the power system, as described above. The damage score may be representative of an amount of damage incurred by the power system according to the damage model and may be determined based on the frequency that the power system is in the operating state and the frequency of the damage measurements associated with the operating state.

As further shown in FIG. 5, process 500 may include determining that the damage score satisfies a threshold damage score associated with the damage model (block 530). For example, the damage management device (e.g., using processor 232, damage monitoring module 240, damage profile module 250, and/or the like) may determine that the damage score satisfies a threshold damage score associated with the damage model, as described above.

As further shown in FIG. 5, process 500 may include performing an action associated with the power system based on the damage score satisfying the threshold damage score (block 540). For example, the damage management device (e.g., using processor 232, damage monitoring module 240, damage profile module 250, damage control mapping module 260, and/or the like) may perform an action associated with the power system based on the damage score satisfying the threshold damage score, as described above.

Process 500 may include additional implementations, such as any single implementation or any combination of implementations described below and/or in connection with one or more other processes described elsewhere herein.

For example, the data set of measurements is received from an electronic control module associated with the power system. The electronic control module may be remotely located from the device. The threshold damage score may be based on a damage parameter associated with the damage measurements and the operating state. The damage parameter may be representative of damage to a particular component of the power system.

In some implementations, the data set of measurements is one histogram of measurements of a plurality of histogram of measurements, and the measurements of the plurality of histograms may be collected at a first rate and the plurality of histograms may be received at a second rate that is slower than the first rate.

The damage management device, when performing the action, may send a notification to an operator station of a machine associated with the power system, and the notification may be configured to alert an operator, via the operator station, that the power system is not to operate in the operating state. The damage management device, when performing the action, may send a control message to a machine associated with the power system, and the control message may be configured to prevent the power system from operating in the operating state.

Additionally, or alternatively a process may include receiving, during a period of operation of a power system, operation measurements for a set of operating parameters associated with the power system. For example, the damage management device, (e.g., using processor 232, damage monitoring module 240, damage profile module 250, and/or the like) may receive, during a period of operation of a power system, operation measurements for a set of operating parameters associated with the power system, as described above.

Such a process may include identifying, based on the operation measurements, an operating state of the power system during the period of operation. For example, the damage management device, (e.g., using processor 232, damage monitoring module 240, damage profile module 250, and/or the like) may identify, based on the operation measurements, an operating state of the power system during the period of operation, as described above.

Such a process may include receiving damage measurements for a damage parameter associated with the power system, wherein the damage measurements are associated with the power system being in the operating state during the period of operation. For example, the damage management device, (e.g., using processor 232, damage monitoring module 240, damage profile module 250, and/or the like) may receive damage measurements for a damage parameter associated with the power system, as described above. The damage measurements are associated with the power system being in the operating state during the period of operation.

Such a process may include storing the damage measurements in a damage profile for the operating state, wherein the damage profile is configured to store the damage measurements based on the power system being in the operating state. For example, the damage management device, (e.g., using processor 232, damage monitoring module 240, damage profile module 250, and/or the like) may store the damage measurements in a damage profile for the operating state, as described above. The damage profile is configured to store the damage measurements based on the power system being in the operating state.

Such a process may include determining, via a damage model and based on the damage profile, a damage score associated with the operating state during the period of operation, wherein the damage model is configured to determine the damage score based on an amount of time that the power system was in the operating state during the period of operation and the damage measurements. For example, the damage management device, (e.g., using processor 232, damage monitoring module 240, damage profile module 250, and/or the like) may determine, via a damage model and based on the damage profile, a damage score associated with the operating state during the period of operation, as described above. The damage model is configured to determine the damage score based on an amount of time that the power system was in the operating state during the period of operation and the damage measurements.

Such a process may include configuring, based on the damage score, one or more control devices to control the power system based on the damage score. For example, the damage management device, (e.g., using processor 232, damage monitoring module 240, damage profile module 250, and/or the like) may configure, based on the damage score, one or more control devices to control the power system based on the damage score, as described above.

Such a process may include additional implementations, such as any single implementation or any combination of implementations described below and/or in connection with one or more other processes described elsewhere herein.

For example, the damage model may further be configured to determine the damage score based on historical damage information associated with the damage parameter, and the historical damage information may include at least one of: previously calculated damage scores associated with the power system, damage scores associated with one or more other power systems associated with the power system, or expected damage scores associated with the power system.

Additionally, or alternatively, the set of operating parameters may include one or more of: an injection pressure, an injection timing, a speed of the power system, a fuel flow rate, an intake manifold pressure, or an intake manifold temperature. The damage parameter and the damage model may be associated with a same component of the power system. In some implementations, the damage management device, when configuring the one or more control devices to control the power system, may configure the one or more control devices to prevent the power system from operating in the operating state when the damage score satisfies a threshold damage score according to the damage model.

The damage management device may determine that the damage score satisfies a damage score threshold. The damage score threshold may be based on the damage parameter and the operating state. The damage management device, when configuring the control devices, may configure, based on determining that the damage score satisfies the damage score threshold, the one or more control devices to prevent the power system from operating in the operating state.

The damage management device may determine that a first damage measurement of the damage measurements satisfies a threshold damage measurement. The threshold damage measurement may be based on the operating state and the damage parameter, and the damage score may be determined based on determining that the first damage measurement satisfies the threshold damage measurement. Additionally, or alternatively, the damage score may be determined according to a predetermined schedule.

Additionally, or alternatively a process may include receiving, during a period of operation of a power system, sets of measurements associated with the power system, wherein the sets of measurements include sets of operation measurements and sets of damage measurements. For example, the damage management device, (e.g., using processor 232, damage monitoring module 240, damage profile module 250, and/or the like) may receive, during a period of operation of a power system, sets of measurements associated with the power system, as described above. The sets of measurements include sets of operation measurements and sets of damage measurements.

Such a process may include identifying operating states of the power system during the period of operation based on the sets of operation measurements. For example, the damage management device, (e.g., using processor 232, damage monitoring module 240, damage profile module 250, and/or the like) may identify operating states of the power system during the period of operation based on the sets of operation measurements, as described above.

Such a process may include, for each set of measurements, storing a corresponding set of damage measurements with a corresponding set of operation measurements in a data structure, wherein the data structure is configured to store damage profiles for the operating states of the power system, wherein the damage profiles for the operating states are based on the sets of damage measurements for the operating states. For example, the damage management device, (e.g., using processor 232, damage monitoring module 240, damage profile module 250, and/or the like) may store a corresponding set of damage measurements with a corresponding set of operation measurements in a data structure, as described above. The data structure is configured to store damage profiles for the operating states of the power system. The damage profiles for the operating states are based on the sets of damage measurements for the operating states.

Such a process may include determining, based on a damage model and the damage profiles, damage scores for the operating states of the power system during the period of operation. For example, the damage management device, (e.g., using processor 232, damage monitoring module 240, damage profile module 250, and/or the like) may determine, based on a damage model and the damage profiles, damage scores for the operating states of the power system during the period of operation, as described above.

Such a process may include configuring one or more control devices to control the power system based on the damage scores. For example, the damage management device, (e.g., using processor 232, damage monitoring module 240, damage profile module 250, and/or the like) may configure one or more control devices to control the power system based on the damage scores, as described above.

Such a process may include identifying operating states of the power system during the period of operation based on the sets of operation measurements. For example, the damage management device, (e.g., using processor 232, damage monitoring module 240, damage profile module 250, and/or the like) may identify operating states of the power system during the period of operation based on the sets of operation measurements, as described above.

Such a process may include additional implementations, such as any single implementation or any combination of implementations described below and/or in connection with one or more other processes described elsewhere herein.

For example, the sets of measurements may be received, during the period of operation, at a first rate, and the damage scores may be determined at a second rate that is at least one thousand times slower than the first rate. The second rate may correspond to a duration of the period of operation.

In some implementations, the damage management device, when identifying the operating states of the power systems, may determine sets of ranges for corresponding operating measurements of the set of operating measurements and designate the operating states based on the sets of ranges. The damage profiles and the damage model may be associated with a same damage parameter, and the damage parameter may be associated with a designated component of the power system.

The damage management device may identify expected damage scores for the operating states corresponding to the damage scores, compare the damage scores for the operating states to the expected damage scores for the operating states, and determine that at least one of the damage scores for the operating states are outside of a threshold range of at least one corresponding one of the expected damage scores. Further, the damage management device, when configuring the one or more control devices, may configure the one or more control devices to control the power system based on the at least one of the damage scores for the operating states being outside of the threshold range of the at least one corresponding one of the expected damage scores.

Although FIG. 5 shows example blocks of process 500, process 500 may include additional blocks, fewer blocks, different blocks, or differently arranged blocks than those depicted in FIG. 5. Additionally, or alternatively, two or more of the blocks of process 500 may be performed in parallel.

INDUSTRIAL APPLICABILITY

During operation, a power system may be damaged at different rates and/or in different ways depending on the use of the power system and/or operating states of the power system (e.g., as defined by one or more operating parameters of the power system). While monitoring the operating states and continuously performing a damage analysis may enable relatively quick detection of damage to the power system, computing resources (e.g., processor resources and/or memory resources) of the power system (e.g., of an ECM of the power system) and/or other device associated with the power system may be limited and/or incapable of continuously monitoring the damage to the power system. Further, as mentioned herein, periodically measuring damage between relatively extended intervals may result in inaccurate damage model calculations and/or irreparable or catastrophic damage to the power system during the extended intervals because too much time may pass between obtaining damage measurements and using the damage model to determine the level of damage of the power system.

As described herein, a damage control system is configured to continuously obtain and/or periodically obtain measurements associated with a power system at a relatively fast rate (e.g., every 10 ms, every 15 ms, every 30 ms, and/or the like), store the measurements during certain periods of operation (e.g., a period of 10 seconds, 20 seconds, 60 seconds, and/or the like), sort and/or organize the measurements in damage profiles (e.g., according to operating states of the power system during the periods of operation), and analyze the damage profiles after each period of operation. In this way, the number of computations of a damage model, and corresponding computing resources needed for the number of computations, are greatly reduced over the same period of time, without losing a desired level of accuracy of the damage model.

For example, assume that a damage model continuously monitors the level of damage of a power system by making between 360 to 720 calculations to measure a level of damage of a power system in a certain operating state. Therefore, every 10 ms (or the amount of time for the damage model to determine the level of damage, and/or the amount of time it may takes for the power system to switch operating states), the damage model may calculate 360 to 720 calculations (e.g., which may be resource heavy calculations), resulting in 36,000 to 72,000 calculations per second. As described herein, because the damage control system may determine the number of operating states during a particular period of operation (e.g., which, for a 20 second time period, could be up to 1000 different operating states), the damage control system may perform 360 to 720 calculations for each operating state after every period of operation. Assuming the period of operation is approximately 20 seconds, the damage control system may calculate between 36,000 to 72,000 calculations every 20 seconds rather than every second (or rather than 720,000 to 144,000 calculations every 20 seconds). Accordingly, because results of the model can simply be extrapolated or weighted based on histograms of frequency and/or time periods during which the power system was in the corresponding operating states, the damage control system does not cause the damage model to continuously calculate or determine the level of damage of the power system, but still uses a thorough set of data to accurately determine the damage to the power system.

Furthermore, damage control system may further conserve computing resources by identifying and/or determining that damage models may not detect damage for certain operating states and/or that certain operating states do not damage the power system. Therefore, when such operating states are identified during a period of operation, the damage control system may not cause a damage model to waste computing resources calculating the damage for those operating states. In this way, further the damage control system can further conserve more computing resources that can be used (e.g., by an ECM of the power system) on other operations of the power system.

Furthermore, damage control system may be configured to determine a damage analysis based on a particular event (e.g., based on a damage measurement satisfying a threshold damage value). In this way, if one or more damage measurements are drastically outside of an expected range, the damage control system may be triggered to use the damage model to determine the damage to the power system during the period of operation (e.g., before the duration of the period of operation expires).

Accordingly, the damage control system, as described herein, may be configured to accurately determine a level of damage to a power system while conserving computing resources associated with using a damage model to determine the level of damage to the power system, relative to previous techniques.

As used herein, the articles "a" and "an" are intended to include one or more items and may be used interchangeably with "one or more." Also, as used herein, the terms "has," "have," "having," or the like are intended to be open-ended terms. Further, the phrase "based on" is intended to mean "based, at least in part, on."

The foregoing disclosure provides illustration and description, but is not intended to be exhaustive or to limit the implementations to the precise form disclosed. Modifications and variations may be made in light of the above disclosure or may be acquired from practice of the implementations. It is intended that the specification be considered as an example only, with a true scope of the disclosure being indicated by the following claims and their equivalents. Even though particular combinations of features are recited in the claims and/or disclosed in the specification, these combinations are not intended to limit the disclosure of various implementations. Although each dependent claim listed below may directly depend on only one claim, the disclosure of various implementations includes each dependent claim in combination with every other claim in the claim set.

What is claimed is:

1. A method, comprising:
   receiving, during a period of operation of a power system, operating measurements for a set of operating parameters associated with the power system;
   identifying, based on the operating measurements, an operating state of the power system during the period of operation;
   receiving damage measurements for a damage parameter associated with the power system,
      wherein the damage measurements are associated with the power system being in the operating state during the period of operation;
   storing the damage measurements in a damage profile for the operating state,
      wherein the damage profile is configured to store the damage measurements based on the power system being in the operating state;
   determining, via a damage model and based on the damage profile, a damage score associated with the operating state during the period of operation,
      wherein the damage model is configured to determine the damage score based on an amount of time that the power system was in the operating state during the period of operation and the damage measurements; and
   configuring, based on the damage score, one or more control devices to control the power system based on the damage score.

2. The method of claim 1, wherein the damage model is further configured to determine the damage score based on historical damage information associated with the damage parameter,
   wherein the historical damage information includes at least one of:
      previously calculated damage scores associated with the power system,
      damage scores associated with one or more other power systems associated with the power system, or
      expected damage scores associated with the power system.

3. The method of claim 1, wherein the set of operating parameters includes one or more of:
   an injection pressure,
   an injection timing,
   a speed of the power system,
   a fuel flow rate,
   an intake manifold pressure, or
   an intake manifold temperature.

4. The method of claim 1, wherein the damage parameter and the damage model are associated with a same component of the power system.

5. The method of claim 1, wherein configuring the one or more control devices to control the power system comprises:
   configuring the one or more control devices to prevent the power system from operating in the operating state when the damage score satisfies a threshold damage score according to the damage model.

6. The method of claim 1, further comprising:
   determining that the damage score satisfies a damage score threshold,
      wherein the damage score threshold is based on the damage parameter and the operating state, and
      wherein configuring the control devices comprises:
         configuring, based on determining that the damage score satisfies the damage score threshold, the one or more control devices to prevent the power system from operating in the operating state.

7. The method of claim 1, further comprising:
   determining that a first damage measurement of the damage measurements satisfies a threshold damage measurement,
      wherein the threshold damage measurement is based on the operating state and the damage parameter, and
      wherein the damage score is determined based on determining that the first damage measurement satisfies the threshold damage measurement.

8. The method of claim 1, wherein the damage score is determined according to a predetermined schedule.

9. A device, comprising:
   a memory; and
   one or more processors, communicatively coupled to the memory, to:
      receive, during a period of operation of a power system, sets of measurements associated with the power system,
         wherein the sets of measurements include sets of operating measurements and sets of damage measurements;

identify operating states of the power system during the period of operation based on the sets of operating measurements;

for each set of measurements, store a corresponding set of damage measurements with a corresponding set of operating measurements in a data structure, wherein the data structure is configured to store damage profiles for the operating states of the power system, wherein the damage profiles for the operating states are based on the sets of damage measurements for the operating states;

determine, based on a damage model and the damage profiles, damage scores for the operating states of the power system during the period of operation; and configure one or more control devices to control the power system based on the damage scores.

10. The device of claim 9, wherein the sets of measurements are received, during the period of operation, at a first rate, and wherein the damage scores are determined at a second rate that is at least one thousand times slower than the first rate.

11. The device of claim 10, wherein the second rate corresponds to a duration of the period of operation.

12. The device of claim 9, wherein the one or more processors that identify the operating states of the power system are to:

determine sets of ranges for corresponding operating measurements of the set of operating measurements; and designate the operating states based on the sets of ranges.

13. The device of claim 9, wherein the damage profiles and the damage model are associated with a same damage parameter, wherein the damage parameter is associated with a designated component of the power system.

14. The device of claim 9, wherein the one or more processors are further to:

identify expected damage scores for the operating states corresponding to the damage scores;

compare the damage scores for the operating states to the expected damage scores for the operating states; and determine that at least one of the damage scores for the operating states are outside of a threshold range of at least one corresponding one of the expected damage scores, wherein the one or more processors that configure the one or more control devices are to:

configure the one or more control devices to control the power system based on the at least one of the damage scores for the operating states being outside of the threshold range of the at least one corresponding one of the expected damage scores.

15. A non-transitory computer-readable medium storing instructions, the instructions comprising:

one or more instructions that, when executed by one or more processors of a device, cause the one or more processors to:

receive a data set of measurements associated with a period of operation of a power system, wherein the data set of measurements identifies a frequency that the power system is in an operating state during the period of operation, and wherein the data set of measurements identifies a frequency of damage measurements associated with the operating state;

determine, using a damage model and the data set of measurements, a damage score for the operating state during the period of operation of the power system, wherein the damage score is representative of an amount of damage incurred by the power system according to the damage model, and wherein the damage score is determined based on the frequency that the power system is in the operating state and the frequency of the damage measurements associated with the operating state;

determine that the damage score satisfies a threshold damage score associated with the damage model; and perform an action associated with the power system based on the damage score satisfying the threshold damage score.

16. The non-transitory computer-readable medium of claim 15, wherein the data set of measurements is received from an electronic control module associated with the power system, wherein the electronic control module is remotely located from the device.

17. The non-transitory computer-readable medium of claim 15, wherein the threshold damage score is based on a damage parameter associated with the damage measurements and the operating state, wherein the damage parameter is representative of damage to a particular component of the power system.

18. The non-transitory computer-readable medium of claim 15, wherein the data set of measurements is one histogram of measurements of a plurality of histogram of measurements, and wherein the measurements of the plurality of histograms are collected at a first rate and the plurality of histograms are received at a second rate that is slower than the first rate.

19. The non-transitory computer-readable medium of claim 15, wherein the one or more instructions, that cause the one or more processors to perform the action, cause the one or more processors to:

send a notification to an operator station of a machine associated with the power system, wherein the notification is configured to alert an operator, via the operator station, that the power system is not to operate in the operating state.

20. The non-transitory computer-readable medium of claim 15, wherein the one or more instructions, that cause the one or more processors to perform the action, cause the one or more processors to:

send a control message to a machine associated with the power system, wherein the control message is configured to prevent the power system from operating in the operating state.

21. The method of claim 1, wherein the operating state corresponds to one or more of one or more measurements for fuel flow within a threshold range of a particular fuel rate or one or more measurements for speed within a threshold range of a particular speed.

* * * * *